United States Patent
Windlass et al.

(10) Patent No.: US 7,283,382 B2
(45) Date of Patent: Oct. 16, 2007

(54) MINIMIZATION OF SIGNAL LOSS DUE TO SELF-ERASE OF IMPRINTED DATA

(75) Inventors: Hitesh Windlass, Hillsboro, OR (US); Jonathan Lueker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 11/171,663

(22) Filed: Jun. 29, 2005

(65) Prior Publication Data

US 2007/0002665 A1    Jan. 4, 2007

(51) Int. Cl.
*G11C 11/22*    (2006.01)
(52) U.S. Cl. .................. 365/145; 365/117; 365/206
(58) Field of Classification Search ........... 365/145, 365/117, 206
See application file for complete search history.

(56) References Cited

U.S. PATENT DOCUMENTS

| | | | |
|---|---|---|---|
| 6,157,563 A | * | 12/2000 | Hirano et al. ............... 365/145 |
| 6,922,350 B2 | | 7/2005 | Coulson et al. |
| 2005/0070032 A1 | | 3/2005 | Richards et al. |

OTHER PUBLICATIONS

Coulson et al—U.S. Appl. No. 10/973,580, filed Oct. 25, 2004—Polymer De-Imprint Circuit Using Negative Voltage.

* cited by examiner

*Primary Examiner*—Huan Hoang
(74) *Attorney, Agent, or Firm*—Cyndi M. Wheeler

(57) ABSTRACT

The effects of a self-erase phenomenon when accessing imprinted ferroelectric memory cells that have non-conductive electrode interfaces that reduce remnant polarization and decrease signal margin are eliminated. A self-erase control pulse asserted after an access pulse is utilized. The self-erase control pulse has a magnitude sufficient to offset a remnant charge on the non-conductive electrode interfaces after the removal of the access pulse.

33 Claims, 6 Drawing Sheets

… (1 / 2)

MINIMIZATION OF SIGNAL LOSS DUE TO SELF-ERASE OF IMPRINTED DATA

BACKGROUND

Description of the Related Art

A ferroelectric polymer memory may be used to store data. Polymer memories may be formed by a layer of polymer between upper and lower parallel electrodes. Successive spaced sets of metal lines may be utilized to define an array of polymer memory cells between upper and lower lines. Data may be stored by changing the polarization of the polymer between metal lines. No transistors may be needed for storage.

The development of polymer memories is recent and various issues are being discovered and resolved.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

In the following description and claims, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

In the following description and claims, the term "data" may be used to refer to both data and instructions. In addition, the term "information" may be used to refer to data and instructions.

Figure 1:
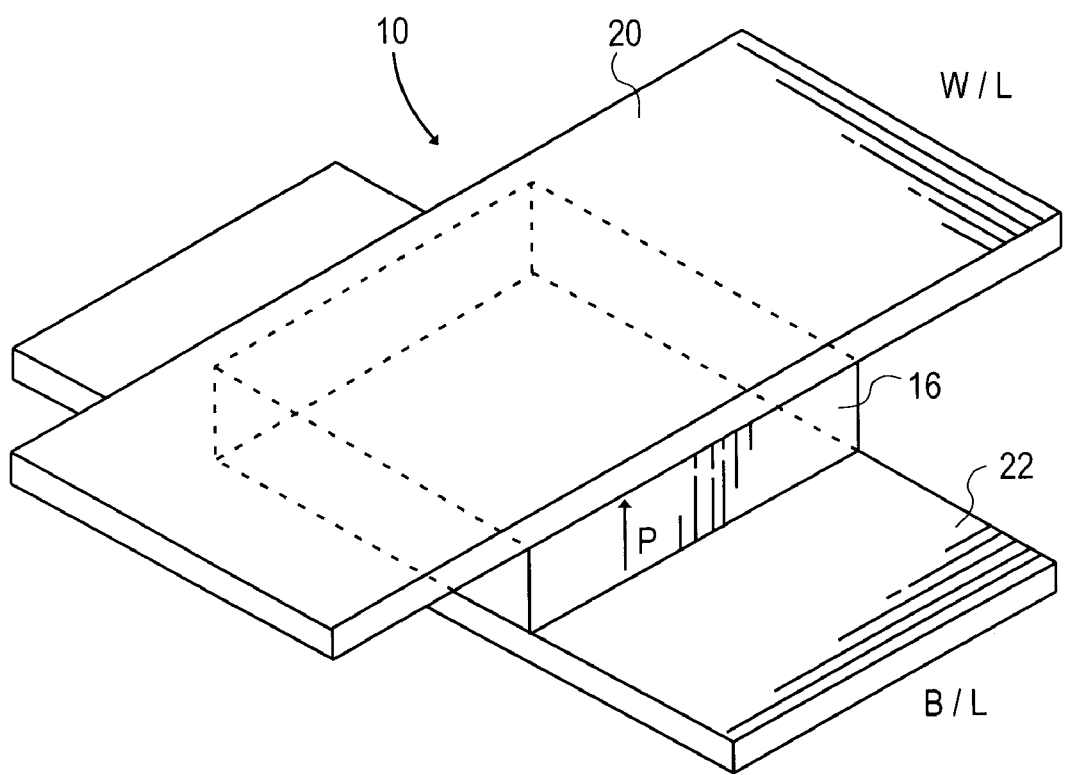
FIG. 1 illustrates a portion of a ferroelectric memory cell according to an embodiment of the present invention.

FIG. 1 illustrates a portion of one type of ferroelectric memory cell 10 that may be used in embodiments of the present invention. Ferroelectric memory is a type of non-volatile memory that utilizes the ferroelectric behavior of certain materials to retain data in a memory device in the form of positive and negative polarization, even in the absence of electric power. A ferroelectric material 16 may contain domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

Ferroelectric material 16 may be a ferroelectric polymer polarizable material, and may also be referred to as a ferroelectric polarizable material or a dipole ferroelectric material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof. Another example of a ferroelectric material may include a ceramic oxide material.

Ferroelectric material 16 having a polarization P may be located between a conductive word line (W/L) 20 and a conductive bit line (B/L) 22. An electric field may be applied to the ferroelectric cell by applying an electric potential (voltage) between word line 20 and bit line 22 so as to effect changes in the polarization of ferroelectric material 16. In more detail, conductive bit line 22 may include a lower conductive electrode. Conductive word line 20 may include an upper conductive electrode. In use, a first voltage may be applied across the upper and lower electrodes. The first voltage may cause the dipoles contained in the polymer to align themselves in a particular orientation. After the first voltage is released from the upper and lower electrodes, the polymer retains the orientation of the dipoles therein, and thus the polymer located between the electrodes maintains its polarization state. A second voltage, of an opposite polarity, may be applied across the upper and lower electrodes to reverse the orientation, and therefore the state, of the dipoles within the polymer. Depending on whether a change of state occurs from the second voltage, a small or large current is generated in the circuit. This current is integrated by other circuits on the chip and the total quantity of charge is compared against a reference value. If this charge is greater than the reference value then a reversal of the memory bit (from zero to one or one to zero is said to have taken place). In this way, read and write operations for a polymer memory device may be executed without a transistor per cell.

Although the embodiment shown contains only two metal lines and one layer of polymer, it should be understood that the number of metal lines may be increased to create an array of memory cells and the number of levels of the memory array may be increased to "stack" memory cells on top of one another.

A controller of another material, for example CMOS, may be used to control voltages applied to each cell in a memory array, thus controlling accesses to the cell, for example, reads and writes of the cell. In order to maximize the voltage appearing across the polymer during a read or write operation, the electrodes chosen for the construction of the cell must be as conductive as possible. Due to limitations related to the fabrication process, a small non-conductive interface is introduced between the conductive electrode and the polymer. This interface itself acts as a capacitor and stores a charge. Thus, the memory cell effectively becomes a ferroelectric capacitor surrounded by a linear capacitor on each side. These linear capacitors end up introducing parasitics into the performance of the memory cell. During high speed operation, this works to the advantage of the device because the charge on these parasitic capacitors (Vboost) supports the reversal of a flip. If Vboost is too large, however, it can result in reversal of the polarization even without the second voltage pulse—a phenomenon termed as "self-erase" and explained in more detail in the following paragraphs.

Figure 2:
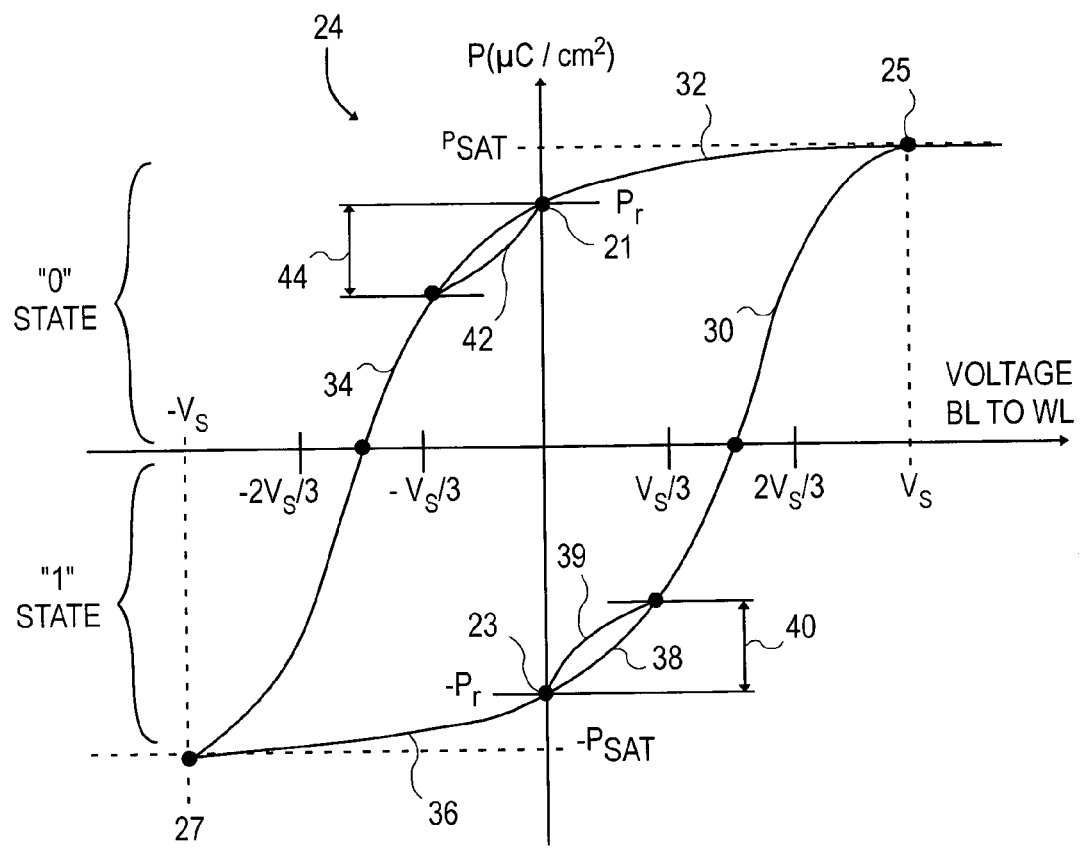
FIG. 2 is a graph of polarization strength as a function of voltage applied to reverse the state of a ferroelectric memory cell according to an embodiment of the present invention.

FIG. 2 shows a simplified hysteresis curve 24 that illustrates idealistically the polarization versus voltage properties of the ferroelectric cell of FIG. 1. When a positive voltage (e.g., $V_{bit\ line}-V_{word\ line}>0$) of sufficiently large magnitude (shown here, for example, as Vs) is applied to the cell, all of the domains in the cell are forced to align, to the extent possible, in the positive direction, and the polarization P reaches the saturation polarization Psat at point 25 on the curve. A further increase in the voltage produces no further increase in the polarization because all of the domains are already aligned as far as possible in the direction of the electric field produced by the voltage between the word line and bit line. In one example, a positive voltage may be applied by applying Vs, for example, about 9 volts, to bit line 22 and applying about 0 volts to word line 20. In another example, two non-zero positive voltages may be applied to bit line 22 and word line 20 to generate a positive voltage across material 16. Note that the voltages applied to achieve Vs may vary with specific implementations and the scope of the present invention is not limited in this respect.

If the voltage is then reduced to 0 V (following path 32 to arrive at point 21), some of the domains switch their orientation (also referred to as rotating, flipping or reversing), but most of the domains retain their orientation. Thus, the ferroelectric material retains a remnant polarization Pr.

For purposes of data storage, ferroelectric cell 10 is considered to be in the logic "0" (zero) state when the polarization P is positive (preferably at Pr), and the logic "1" (one) state when the polarization is negative (preferably at −Pr). The assignment of a logic "1" or logic "0" to a positive or negative polarization is arbitrary, and in other embodiments, opposite conventions may be used.

If a negative voltage of sufficiently large magnitude (shown here, for example, as −Vs) is then applied to the word line 20 relative to bit line 22 (following path 34 to point 27), all of the domains are forced to switch their orientation, and the polarization reaches the negative saturation level −Psat. Removing this negative voltage (following path 36 to point 23) allows some of the domains to switch, and the cell polarization reaches the negative remnant polarization −Pr. If the positive voltage Vs is again applied to the cell (following path 30 to point 25), the domains once again switch their orientation, and the cell takes on the positive saturation polarization Psat until the voltage is removed, and the polarization reaches the positive saturation level +Pr.

Ferroelectric materials also exhibit resilience, wherein a ferroelectric cell may return close to its remnant polarization despite a small disturbance. During an access cycle, bit lines and word lines of neighboring cells may be driven with voltages that provide quiescent level electric fields across the neighboring ferroelectric cells. Quiescent level voltages may be defined in accordance with the resilient qualities of the ferroelectric cell, wherein polarization disturbances of the cells are kept within a recovery range. For example, the quiescent level, also referred to as a disturb voltage threshold, may be a magnitude no greater than ⅓ the switching level voltage. For example, assuming a one state storage condition for a ferroelectric cell, as represented by remnant polarization position 23 of hysteresis curve 24, a small voltage disturbance of Vs/3 may provide a small polarization shift 40 along path 38. However, once the voltage is removed, a large portion of the domains of the ferroelectric cell may realign their orientations to that of the cell's overall orientation, as illustrated by return path 39 of hysteresis curve 24. Note that the return path may not return to position 23 but to a point slightly above position 23. Many small voltage disturbances may accumulate overtime, moving the storage condition along path 38 and affecting memory performance. Large voltage disturbances, for example, when the voltage is greater than Vs/3, may move the charge of the cell significantly closer to position 25 along path 30 of hysteresis curve 24. Additionally, a large negative voltage disturbance, for example, a voltage more negative than −Vs/3, may move the charge of the cell significantly closer to position 27 along path 34 of hysteresis curve 24. It is desirable to keep voltage disturbances to a minimum, preferably below the disturb voltage threshold. Thus, there may be only a narrow operating window in which the drive voltage is sufficiently high and in which the disturb voltage of Vs/3 is sufficiently low.

In addition to being affected by voltage disturbances, polymer memories are affected by the length of time between accesses and may become imprinted. That is, after an extended period of time, a polymer memory cell that is polarized in one direction may become imprinted in that direction. As a cell becomes imprinted, an increasing amount of voltage is required to de-imprint the cell as the Vboost coming from the parasitic interfacial capacitor dissipates during the imprinting period.

Figure 3:
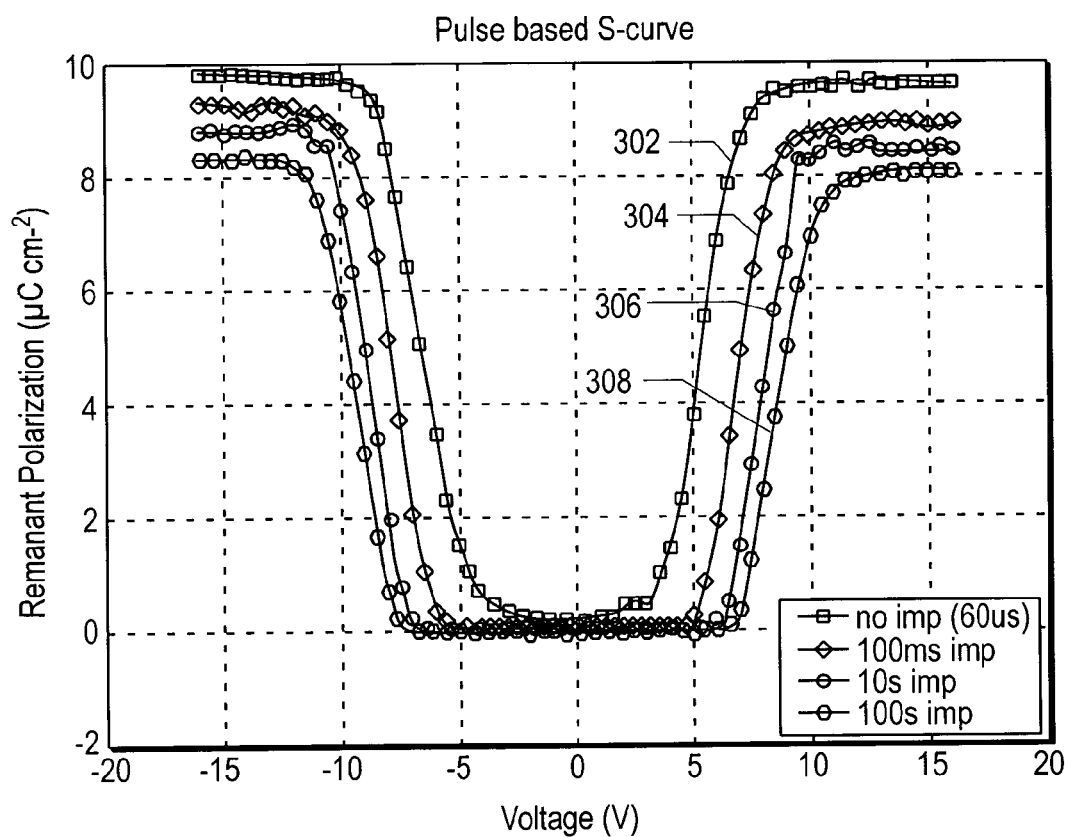
FIG. 3 illustrates a graph comparing polarization strength of a polymer memory device in non-imprinted and varying degrees of imprinted states as a function of voltage applied to reverse the state of a memory device.

FIG. 3 illustrates a graph comparing polarization strength of a polymer memory device in non-imprinted and varying degrees of imprinted state as a function of voltage applied to a memory device. Curve 302 illustrates the polarization strength after 50 microseconds when the device is not imprinted. Curves 304, 306 and 308 illustrate the polarization strength after 100 milliseconds, 10 seconds and 100 seconds, respectively, when the device is imprinted. As illustrated, the polarization strength decreases with increased imprinting. Decreased polarization strength of the cell provides decreased operating margin. A contributing cause of this phenomenon is illustrated in FIGS. 4A-4C.

Figure 4A:
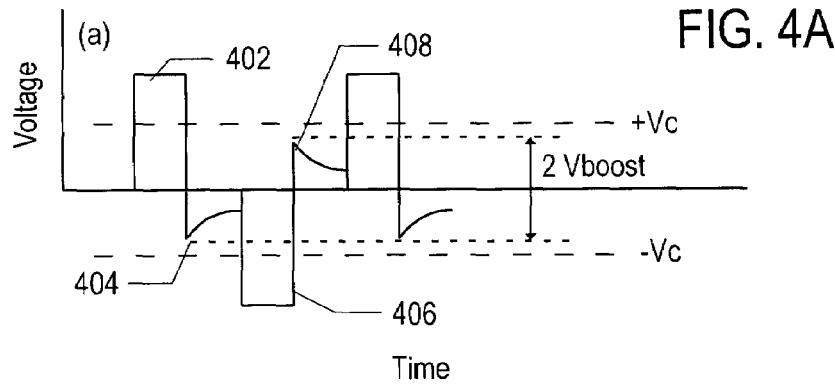
FIGS. 4A-4C illustrate various access pulses with and without a self-erase control pulse as a function of time diagrams according to an embodiment of the present invention.

FIG. 4A illustrates the effects of write pulses on a non-imprinted memory cell. Due to the frequency of the write pulses, the memory cell does not become imprinted. As illustrated, a write pulse 402 of greater than positive Vc is applied to write the cell to, for example, a zero. A negative remnant voltage 404 (referred to as Vboost above) occurs on the non-conductive interfaces of the electrodes and the polymer as write pulse 402 is removed. A write pulse 406 of less than negative Vc is applied to write the cell to for example, a one. A positive remnant voltage 408 occurs on the conductive electrodes as write pulse 406 is removed. Write pulses 402 and 406 occur with a frequency such that the cell does not become imprinted and the remnant voltage does not significantly decay between pulses. As illustrated, the remnant voltage, or Vboost, remaining on the non-conductive electrode interfaces is kept within the coercive voltage bounds of the ferroelectric device, that is, between positive and negative Vc. That is, the remnant voltage does not exceed the disturb voltage threshold of the device.

Figure 4B:
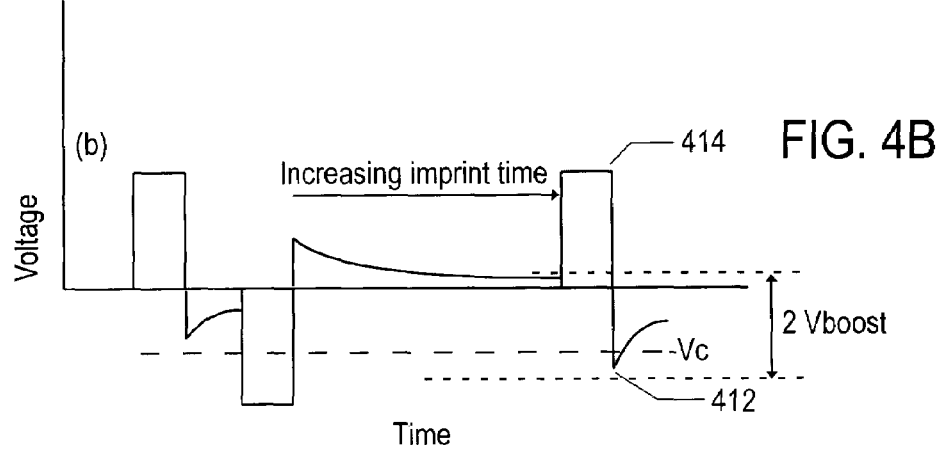
Figure 4C:
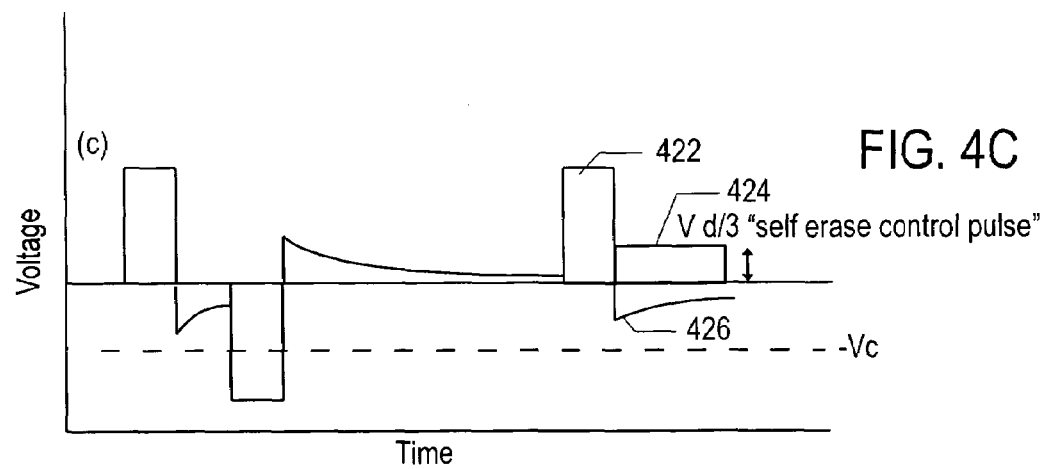

FIG. 4B illustrates the effects of write pulses on an imprinted memory cell. A contributing cause of decreased polarization strength was discovered to be the decayed remnant voltage (Vboost) on the non-conducting electrode-polymer interfaces. As the memory cell imprints, Vboost decays, thus requiring a higher voltage to flip the cell's polarity. Once the cell flips completely, Vboost charges again and comes back in full swing when the external voltage is brought to zero. If the magnitude of this effective swing is greater than the coercive field of the ferroelectric, that is, greater than the disturb voltage, the dipoles in the material are un-flipped, thereby reducing the saturation polarization for that state. As illustrated in FIG. 4B, negative remnant voltage 412 of less than negative Vc occurs on the electrode-polymer interface as write pulse 414 is removed. The remnant voltage 412 exceeds negative Vc, resulting in self-erase of the cell.

Due to the un-flipping of the dipoles by the remnant voltage on the electrodes, even with sufficient voltage to overdrive the memory cell and bring it out of imprint, the amount of signal recovered is increasingly lower as the imprint time for the cell is increased. In product operation this is a significant issue because after some imprint time, even though the cell may be read completely, the cell will be unable to hold on to the new polarization state after the second pulse is withdrawn due to the self-erase from the falling edge of the second pulse.

FIG. 4C illustrates the use of a write pulse configuration on an imprinted memory cell that reduces the self-erase phenomenon according to an embodiment of the present invention. As illustrated, write pulse 422 includes an extension 424 that prevents remnant voltage 426 from exceeding negative Vc and self-erasing the memory cell. According to an embodiment of the present invention, the signal strength of polymer memory devices is improved by managing the release of the memory cell from a high voltage stage to zero voltage stage when accessing the cell. By managing the release of access pulses, for example read or write pulses, by providing a special pulse extension, referred to as a "self-erase control pulse," the swing of Vboost is dampened, limiting the effective voltage to below the coercive voltage of the ferroelectric. Managing the release of read and write pulses allows the signal strength that was being lost to self-erase to be preserved. Managed release of a read or write operation through the self-erase control pulse limits the swing of Vboost and prevents self-erase. As illustrated, self-erase control pulse 424 has a voltage magnitude less than write pulse 422 and is approximately Vd/3, the disturb voltage threshold.

Figure 5:
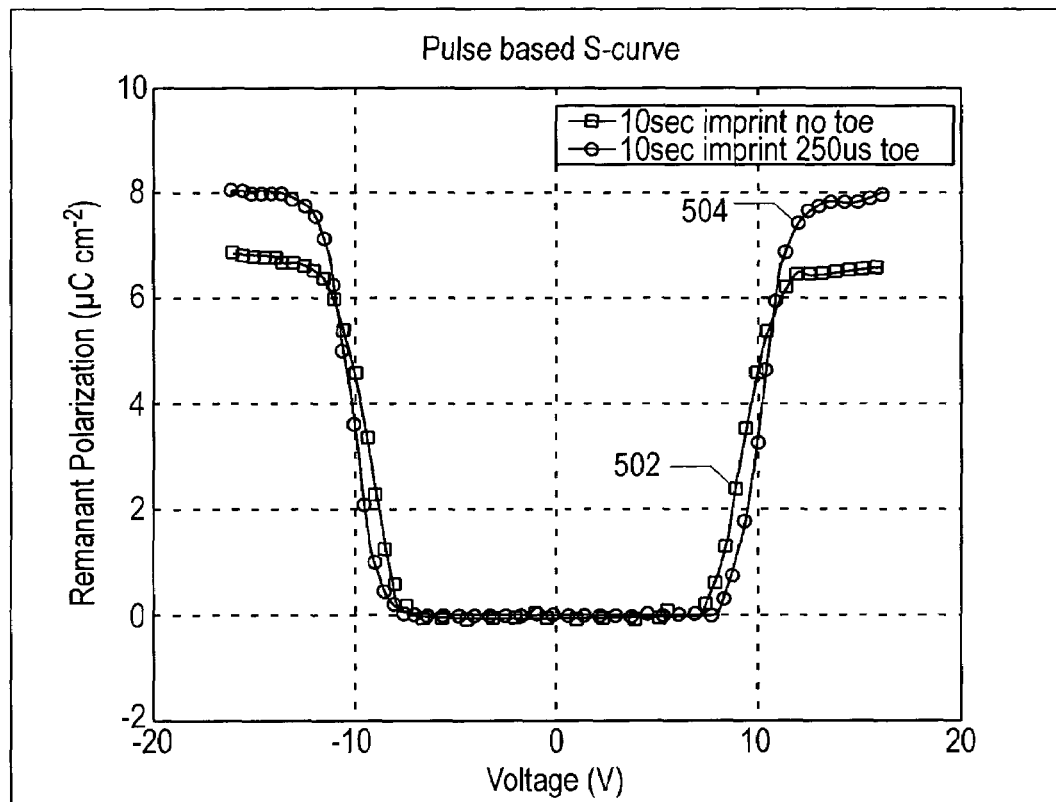
FIG. 5 illustrates a graph comparing polarization strength of a polymer memory device in an imprinted state as a function of voltage applied with and without a self-erase control pulse according to an embodiment of the present invention.

FIG. 5 illustrates a graph comparing polarization strength of a polymer memory device in an imprinted state as a function of voltage applied with and without a self-erase control pulse according to an embodiment of the present invention. In experiments, degradation was minimized and approximately 1 uC/cm2 (10%) of signal strength that was lost without the use of a self-erase control pulse was preserved with the use of the self-erase control pulse.

Curve 502 illustrates the remnant polarization as a function of an applied voltage without a self-erase control pulse for a 10 second imprinted cell. Curve 504 illustrates the remnant polarization as a function of an applied voltage with a self-erase control pulse for a 10 second imprinted cell. Curve 504 provides a higher saturation level of polarization and thereof a stronger signal than curve 502, providing a more optimum operational signaling margin.

According to an embodiment of the present invention, the length and/or timing of the self-erase control pulse may be adjusted according to the Vboost discharge rate for a given electrode-polymer memory combination. The magnitude of the pulse may also be adjusted based on the combination of voltages available from the controller.

By increasing the signal strength of the memory cell at little or no cost to the processing or performance of the device, the signal budget for reliability and process may be increased.

According to an embodiment of the present invention, a self-erase control pulse may be added to an access pulse for all access operations. Alternatively, imprint time may be tracked and a self-erase control pulse may be added only when a cell is determined to be imprinted.

Figure 6:
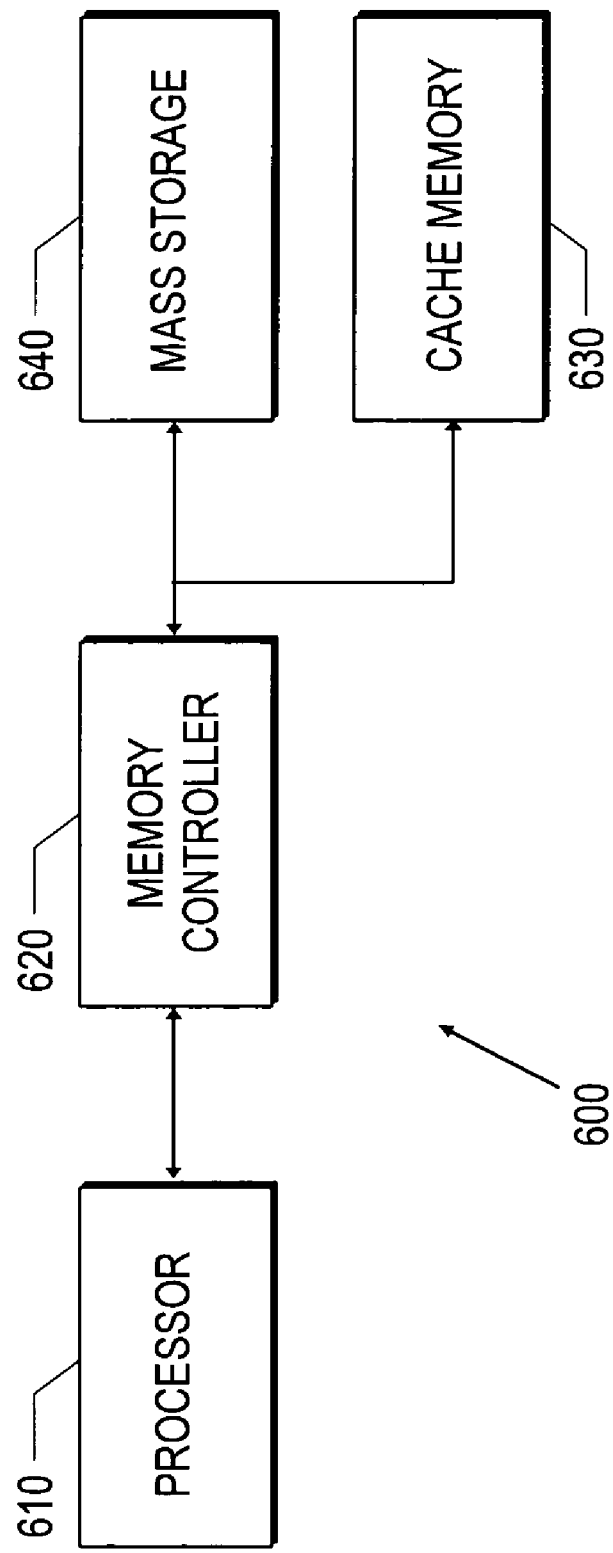
FIG. 6 is a block diagram illustrating a portion of a computing system according to an embodiment of the present invention.

Turning to FIG. 6, shown is a block diagram of a computing system 600 in accordance with an embodiment of the present invention. As shown in FIG. 6, in one embodiment computing system 600 may include a processor 610, a memory controller 620, a cache memory 630, and a mass storage 640. Processor 610 may be a general-purpose or special-purpose processor such as a microprocessor, microcontroller, application specific integrated circuit (ASIC), a programmable gate array (PGA), or the like.

In one embodiment, cache memory 630 may be a relatively large non-volatile disk cache memory adapted to cache information for mass storage 640. For example, cache memory 630 may be a ferroelectric polymer memory. Mass storage 640 may be a mass storage device such as, for example, a disk memory having a storage capacity of at least about one gigabyte. Mass storage 640 may be an electromechanical hard disk memory, an optical disk memory, or a magnetic disk memory, although the scope of the present invention is not limited in this respect. In one embodiment, cache memory 630 may have a storage capacity of at least about 500 megabytes and may include ferroelectric memory cells, wherein each cell includes a ferroelectric polymer material located between at least two conductive lines. The ferroelectric polymer material may be a ferroelectric polarizable material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof.

In an alternate embodiment, cache memory 630 may be another type of plastic memory such as, for example, a resistive change polymer memory. In this embodiment, the plastic memory may include a thin film of polymer memory material sandwiched at the nodes of an address matrix. The resistance at any node may be altered from a few hundred ohms to several megohms by applying an electric potential across the polymer memory material to apply a positive or negative current through the polymer material to alter the resistance of the polymer material. Potentially different resistance levels may store several bits per cell and data density may be increased further by stacking layers.

The memory of the apparatus may be a ferroelectric polymer memory, a ferroelectric oxide memory, or any other ferroelectric memory, although the scope of the present invention is not limited in this respect. In alternate embodiments, the memory may also be a non-ferroelectric memory.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   providing a first voltage pulse across a plurality of electrodes to access a memory cell; and
   providing a second voltage pulse after and adjacent to the first voltage pulse across the plurality of electrodes;
   wherein the first voltage pulse is of a sufficient magnitude to change a polarity of the memory cell; and
   wherein the second voltage pulse is of a sufficient magnitude to overcome a remnant voltage on the memory cell.

2. The method as recited in claim 1, wherein the second voltage pulse is of a sufficient magnitude to prevent the remnant voltage on the plurality of electrodes from exceeding a disturb voltage threshold of the memory cell.

3. The method as recited in claim 1, wherein the second voltage pulse is of a sufficient duration to prevent a stored charge on the plurality of electrodes from self-erasing the memory cell.

4. The method as recited in claim 1, wherein a magnitude of the second voltage pulse is greater than zero.

5. The method as recited in claim 1, wherein a magnitude of the first voltage pulse is sufficient to change the polarity of the memory cell if the memory cell is in an imprinted state.

6. The method as recited in claim 5, wherein the imprinted state requires a voltage pulse with an elevated voltage level to change the polarity of the memory cell.

7. The method as recited in claim 1, wherein the plurality of electrodes are conductive electrodes.

8. The method as recited in claim 7, wherein an interface between the plurality of electrodes and the memory cell is non-conductive.

9. The method as recited in claim 1, wherein a magnitude of the second voltage pulse is approximately a disturb voltage threshold of the memory cell.

10. The method as recited in claim 1, wherein the memory cell includes a polymer ferroelectric material.

11. The method as recited in claim 1, wherein the memory cell includes a ceramic ferroelectric material.

12. The method as recited in claim 1, wherein the memory cell is accessed to write a value to the memory cell.

13. An apparatus comprising:
    a memory array including at least one memory cell and a plurality of electrodes to access the at least one memory cell; and
    a memory controller to apply a first voltage pulse across the plurality of electrodes to access a memory cell, and to apply a second voltage pulse after and adjacent to the first voltage pulse across the plurality of electrodes;
    wherein the first voltage pulse is of a sufficient magnitude to change a polarity of the memory cell; and
    wherein the second voltage pulse is of a sufficient magnitude to prevent a remnant voltage on the plurality of electrodes from exceeding a disturb voltage threshold of the memory cell.

14. The apparatus as recited in claim 13, wherein the second voltage pulse is of a sufficient duration to prevent a stored charge on the plurality of electrodes from self-erasing the memory cell.

15. The apparatus as recited in claim 13, wherein a magnitude of the second voltage pulse is greater than zero.

16. The apparatus as recited in claim 13, wherein a magnitude of the first voltage pulse is sufficient to change the polarity of the memory cell if the memory cell is in an imprinted state.

17. The apparatus as recited in claim 16, wherein the imprinted state requires a voltage pulse with an elevated voltage level to change the polarity of the memory cell.

18. The apparatus as recited in claim 13, wherein the plurality of electrodes are conductive electrodes.

19. The apparatus as recited in claim 18, wherein an interface between the plurality of electrodes and the memory cell is non-conductive.

20. The apparatus as recited in claim 13, wherein a magnitude of the second voltage pulse is approximately a disturb voltage threshold of the memory cell.

21. The apparatus as recited in claim 13, wherein the memory cell includes a polymer ferroelectric material.

22. The apparatus as recited in claim 13, wherein the memory cell includes a ceramic ferroelectric material.

23. A system comprising:
    a memory array including at least one memory cell and a plurality of electrodes to access the at least one memory cell; and
    a memory controller to apply a first voltage pulse across the plurality of electrodes to access the at least one memory cell, and to apply a second voltage pulse after and adjoining the first voltage pulse across the plurality of electrodes;

wherein the first voltage pulse is of a sufficient magnitude to change a polarity of the at least one memory cell; and wherein the first voltage pulse has a greater magnitude than the second voltage pulse.

24. The system as recited in claim 23, wherein the second voltage pulse is of a sufficient magnitude to prevent a remnant voltage on the plurality of electrodes from exceeding a disturb voltage threshold of the at least one memory cell.

25. The system as recited in claim 23, wherein the second voltage pulse is of a sufficient duration to prevent a stored charge on the plurality of electrodes from self-erasing the at least one memory cell.

26. The system as recited in claim 23, wherein a magnitude of the second voltage pulse is greater than zero.

27. The system as recited in claim 23, wherein a magnitude of the first voltage pulse is sufficient to change the polarity of the at least one memory cell if the at least one memory cell is in an imprinted state.

28. The system as recited in claim 27, wherein the imprinted state requires a voltage pulse with an increased voltage level to change the polarity of the at least one memory cell.

29. The system as recited in claim 23, wherein the plurality of electrodes are conductive electrodes.

30. The system as recited in claim 29, wherein an interface between the plurality of electrodes and the memory cell is non-conductive.

31. The system as recited in claim 23, wherein a magnitude of the second voltage pulse is approximately a disturb voltage threshold of the at least one memory cell.

32. The system as recited in claim 23, wherein the at least one memory cell is a polymer ferroelectric material.

33. The system as recited in claim 23, wherein the at least one memory cell is a ceramic ferroelectric material.

* * * * *